(12) United States Patent
Lin et al.

(10) Patent No.: US 9,893,015 B2
(45) Date of Patent: Feb. 13, 2018

(54) SEMICONDUCTOR DEVICE (71) Applicant: DELTA ELECTRONICS, INC., Taoyuan (TW)

(72) Inventors: Li-Fan Lin, Taoyuan (TW); Chun-Chieh Yang, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/086,556

(22) Filed: Mar. 31, 2016

(65) Prior Publication Data
US 2017/0092642 A1    Mar. 30, 2017

(30) Foreign Application Priority Data
Sep. 24, 2015  (TW) .............................. 104131553 A (51) Int. Cl.
| | |
|---|---|
| *H01L 27/088* | (2006.01) |
| *H01L 23/528* | (2006.01) |
| *H01L 23/522* | (2006.01) |
| *H01L 29/423* | (2006.01) |
| *H01L 29/417* | (2006.01) |
| *H01L 29/06* | (2006.01) |

(52) U.S. Cl.
CPC ...... *H01L 23/5286* (2013.01); *H01L 23/5226* (2013.01); *H01L 29/41758* (2013.01); *H01L 29/4238* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 7,417,257 B2 | 8/2008 | Beach et al. | |
| 7,550,781 B2 | 6/2009 | Kinzer et al. | |
| 9,318,607 B2 * | 4/2016 | Seo | ...... H01L 23/5286 |
| 2005/0189561 A1 | 9/2005 | Kinzer et al. | |
| 2011/0204418 A1* | 8/2011 | Onishi | ...... H01L 29/0692 |
| | | | 257/194 |
| 2013/0119486 A1* | 5/2013 | Kaibara | ...... H01L 23/4824 |
| | | | 257/411 |

(Continued)

FOREIGN PATENT DOCUMENTS

| | | |
|---|---|---|
| CN | 1421927 | 6/2003 |
| TW | 533579 | 5/2003 |
| TW | 200952120 | 12/2009 |

*Primary Examiner* — Julio J Maldonado
*Assistant Examiner* — Stanetta Isaac
(74) *Attorney, Agent, or Firm* — Hauptman Ham, LLP (57) ABSTRACT

A semiconductor device includes an element layer, plural source electrodes, plural drain electrodes, plural gate electrodes, a source bus bar, a drain bus bar, a first gate bus bar, and a second gate bus bar. The source electrodes, the drain electrodes, and the gate electrodes are disposed on the element layer and extend along a first direction. The gate electrodes are respectively disposed between the source and drain electrodes. The source and drain bus bars and the first and second gate bus bars extend along a second direction interlaced with the first direction. The source bus bar and the drain bus bar are electrically connected to the source electrodes and the drain electrodes, respectively. The first and second gate bus bars are connected to the gate electrodes. The first bus bar is disposed at one end of the source electrodes. The source electrode crosses the second gate bus bar.

17 Claims, 7 Drawing Sheets

(56) References Cited

U.S. PATENT DOCUMENTS

| | | | |
|---|---|---|---|
| 2014/0110787 A1 | 4/2014 | Wen et al. | |
| 2015/0014775 A1* | 1/2015 | Seo | H01L 23/5286 257/351 |
| 2015/0061038 A1* | 3/2015 | Takewaki | H01L 27/088 257/401 |

* cited by examiner

SEMICONDUCTOR DEVICE

RELATED APPLICATIONS

This application claims priority to Taiwan Application Serial Number 104131553, filed Sep. 24, 2015, which is herein incorporated by reference.

BACKGROUND

Field of Disclosure

The present disclosure relates to a semiconductor device.

Description of Related Art

A field effect transistor is a switching device that utilizes the electric field effect in a material to control the current. Field effect transistors are widely applied to circuits of semiconductor devices. More specifically, a field effect transistor includes a gate, a source, a drain, and an active area. The source and the drain are respectively located on two opposite sides of the active area. By controlling a voltage applied to the gate, the electric field in the active area is affected. The current is thus conducted between the source and the drain so that the field effect transistor is in on-state.

SUMMARY

An aspect of the present disclosure is to provide a semiconductor device including an element layer, a plurality of source electrodes, a plurality of drain electrodes, a plurality of gate electrodes, a source bus bar, a drain bus bar, at least one first gate bus bar, and at least one second gate bus bar. The source electrodes and the drain electrodes are disposed on the element layer. The source electrodes and the drain electrodes are arranged alternately and extend along a first direction. The gate electrodes are disposed on the element layer and respectively disposed between the source electrodes and the drain electrodes and extend along the first direction. The source bus bar is disposed on the element layer and electrically connected to the source electrodes and extends along a second direction. The second direction is interlaced with the first direction. The drain bus bar is disposed on the element layer and electrically connected to the drain electrodes and extends along the second direction. The source bus bar and the drain bus bar are respectively disposed at two opposite ends of at least one of the source electrodes. The first gate bus bar is connected to the gate electrodes and extends along the second direction. The first gate bus bar is disposed at one end of at least one of the source electrodes. The second gate bus bar is connected to the gate electrodes and extends along the second direction. The source electrodes cross the second gate bus bar.

In some embodiments, a first distance is formed between the source bus bar and the drain bus bar, and a second distance is formed between the second gate bus bar and the first gate bus bar. The first distance is greater than the second distance.

In some embodiments, one of the source electrodes includes a plurality of source bodies and a source connecting portion. The source bodies are disposed on the element layer and disposed on two opposite sides of the second gate bus bar. The source connecting portion crosses the second gate bus bar and is connected to the source bodies. The source connecting portion is electrically insulated from the second gate bus bar.

In some embodiments, one of the drain electrodes includes a plurality of drain bodies and a drain connecting portion. The drain bodies are disposed on the element layer and disposed on the two opposite sides of the second gate bus bar. The drain connecting portion crosses the second gate bus bar and is connected to the drain bodies. The drain connecting portion is electrically insulated from the second gate bus bar.

In some embodiments, the semiconductor device further includes an insulation layer covering the second gate bus bar. One of the source electrodes comprises a plurality of source bodies, a source connecting portion, and a plurality of source vias. The source bodies are disposed on the element layer and disposed on two opposite sides of the second gate bus bar, and the insulation layer covers the source bodies. The source connecting portion is disposed on the insulation layer and the source bodies and crosses the second gate bus bar. The source vias are located in the insulation layer and interconnect the source connecting portion and the source bodies.

In some embodiments, one of the drain electrodes includes a plurality of drain bodies, a drain connecting portion, and a plurality of drain vias. The drain bodies are disposed on the element layer and disposed on the two opposite sides of the second gate bus bar, and the insulation layer covers the drain bodies. The drain connecting portion is disposed on the insulation layer and the drain bodies and crosses the second gate bus bar. The drain vias are located in the insulation layer and interconnect the drain connecting portion and the drain bodies.

In some embodiments, at least one of the source bodies is disposed between the first gate bus bar and the second gate bus bar.

In some embodiments, at least one of the drain bodies is disposed between the first gate bus bar and the second gate bus bar.

In some embodiments, the element layer includes an active area and an isolated area. The source bodies and the drain bodies are located in the active area, and the second gate bus bar is located in the isolated area.

In some embodiments, a plurality of the first gate bus bars are located at two opposite ends of at least one of the source electrodes, and the second gate bus bar is disposed between the first gate bus bars.

In some embodiments, a number of the at least one second gate bus bar is plural.

In some embodiments, the semiconductor device of further includes a gate pad connected to the first gate bus bar and the second gate bus bar.

In some embodiments, two of the gate pads are respectively located at two opposite ends of the first gate bus bar and the second gate bus bar.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and elements are schematically depicted in order to simplify the drawings.

Figure 1:
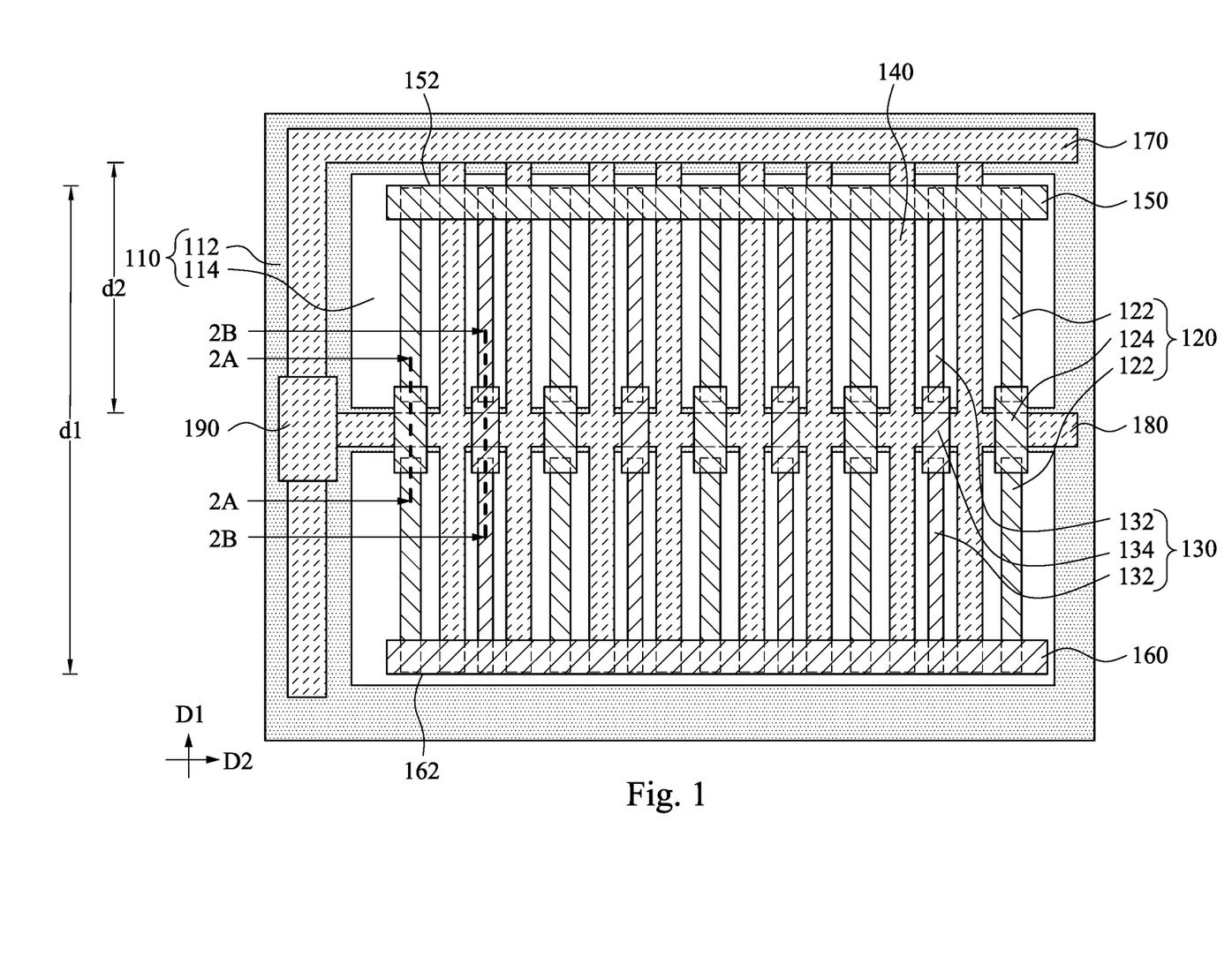
FIG. 1 is a top view of a semiconductor device according to one embodiment of the present disclosure.

FIG. 1 is a top view of a semiconductor device according to one embodiment of the present disclosure. The semiconductor device includes an element layer 110, a plurality of source electrodes 120, a plurality of drain electrodes 130, a plurality of gate electrodes 140, a source bus bar 150, a drain bus bar 160, at least one first gate bus bar 170, and at least one second gate bus bar 180. For example, in FIG. 1, numbers of the first gate bus bar 170 and the second gate bus bar 180 are both one. The source electrodes 120 and the drain electrodes 130 are disposed on the element layer 110. The source electrodes 120 and the drain electrodes 130 are arranged alternately and extend along a first direction D1. The gate electrodes 140 are disposed on the element layer 110 and respectively disposed between the source electrodes 120 and the drain electrodes 130, and extend along the first direction D1. The source bus bar 150 is disposed on the element layer 110 and electrically connected to the source electrodes 120, and extends along a second direction D2. The second direction D2 is interlaced with the first direction D1. In some embodiments, the second direction D2 is substantially perpendicular to the first direction D1. However, in some other embodiments, an embodiment falls within the claimed scope as long as the second direction D2 is not parallel with the first direction D1. The drain bus bar 160 is disposed on the element layer 110 and electrically connected to the drain electrodes 130, and extends along the second direction D2. The source bus bar 150 and the drain bus bar 160 are respectively disposed at two opposite ends of at least one of the source electrodes 120. The first gate bus bar 170 is connected to the gate electrodes 140 and extends along the second direction D2. The first gate bus bar 170 is disposed at one end of at least one of the source electrodes 120. The second gate bus bar 180 is connected to the gate electrodes 140 and extends along the second direction D2. The source electrodes 120 cross the second gate bus bar 180.

In addition, in some embodiments, the source bus bar 150 and the drain bus bar 160 are further disposed at two opposite ends of at least one of the drain electrodes 130, respectively. The first gate bus bar 170 is further disposed at one end of at least one of the drain electrodes 130. The drain electrodes 130 cross the second gate bus bar 180.

By disposing the first gate bus bar 170 and the second gate bus bar 180, gate resistances of the semiconductor device according to the present embodiment can be reduced to improve performances of the semiconductor device. In greater detail, in the present embodiment, each of the gate electrodes 140 is connected to the first gate bus bar 170 and the second gate bus bar 180. An external signal source can transmit a current to each of the gate electrodes 140 through these two gate bus bars. As compared with the prior art interdigitated gate electrode that has a single gate bus bar, current paths from the gate bus bars (that is, the first gate bus bar 170 and the second gate bus bar 180) to the gate electrodes 140 are shortened. As a result, an overall gate resistance is reduced to improve the performances of the semiconductor device.

According to the present embodiment, the source bus bar 150 and the drain bus bar 160 are respectively disposed at two opposite ends of the source electrodes 120, the drain electrodes 130, and the gate electrodes 140. The source bus bar 150 is connected to one end of each of the source electrodes 120 to constitute a finger structure. The drain bus bar 160 is connected to one end of each of the drain electrodes 130 to constitute another finger structure. In addition, the first gate bus bar 170 is connected to one end of each of the gate electrodes 140. The second gate bus bar 180 is connected to any position of each of the gate electrodes 140 between two ends of the each of the gate electrodes 140.

In FIG. 1, a first distance d1 is formed between the source bus bar 150 and the drain bus bar 160, and a second distance d2 is formed between the second gate bus bar 180 and the first gate bus bar 170. The first distance d1 is greater than the second distance d2. More specifically, the source bus bar 150 has a side 152 opposite to the drain bus bar 160, and the drain bus bar 160 has a side 162 opposite to the source bus bar 150. The first distance d1 is between the side 152 and the side 162. For example, the first distance d1 is approximately 800 micrometers (μm). Hence, in FIG. 1, lengths of each of the source electrodes 120, each of the drain electrodes 130, and each of the gate electrodes 140 are approximately 800 micrometers. In addition, the second distance d2 is approximately 400 micrometers. Current paths of the gate electrodes 140 are thus shortened by about half by the second gate bus bar 180 to significantly reduce gate resistances. However, in some other embodiments, numerical values for the first distance d1 and the second distance d2 are not limited to the above numerical values.

In FIG. 1, the second distance d2 is half the first distance d1. In other words, the second gate bus bar 180 is disposed at centers of the source electrodes 120, the drain electrodes 130, and the gate electrodes 140. However, in some other embodiments, the second gate bus bar 180 may deviate from the centers of the source electrodes 120, the drain electrodes 130, and the gate electrodes 140 so that the second distance d2 may be greater than or smaller than half the first distance d1. Basically, an embodiment falls within the claimed scope as long as the second gate bus bar 180 is disposed at any position of each of the gate electrodes 140 between the two ends of the each of the gate electrodes 140 to shorten the current paths of the gate electrodes 140.

Figure 2A:
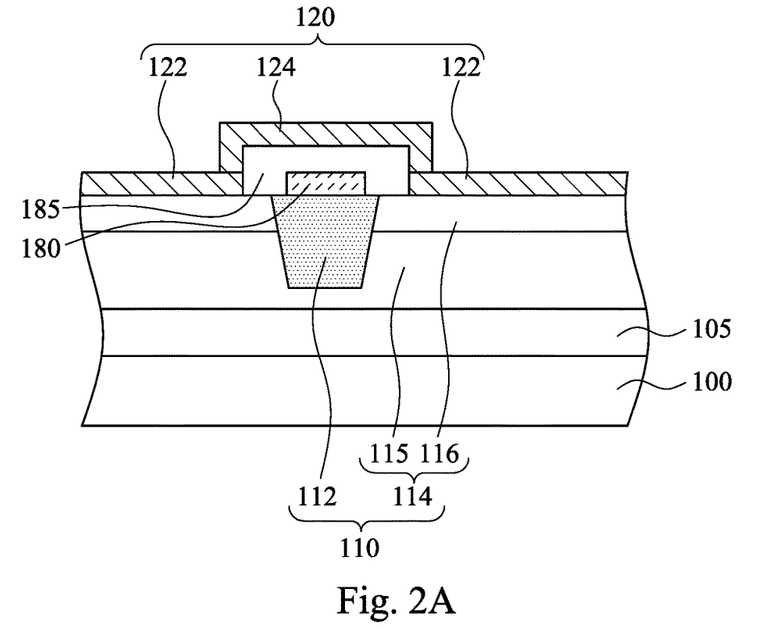
FIG. 2A is a cross-sectional view taking along line 2A-2A of FIG. 1.

FIG. 2A is a cross-sectional view taking along line 2A-2A of FIG. 1. Reference is made to FIGS. 1 and 2A. In the present embodiment, the source electrode 120 includes a plurality of source bodies 122 and a source connecting portion 124. For example, the source electrode 120 includes the two source bodies 122 and the one source connecting portion 124 according to the present embodiment. The source bodies 122 are disposed on the element layer 110 and disposed on two opposite sides of the second gate bus bar 180. The source connecting portion 124 crosses the second gate bus bar 180 and connects to the source bodies 122. The source connecting portion 124 is electrically insulated from the second gate bus bar 180. For example, the semiconductor device further includes an insulation layer 185 covering the second gate bus bar 180 and disposed between the second gate bus bar 180 and the source connecting portion 124 so that the source connecting portion 124 is electrically insulated from the second gate bus bar 180. Each of the source bodies 122 may be an ohmic electrode and the source connecting portion 124 may be a conductive layer, and the present disclosure is not limited in this regard.

In the present embodiment, the element layer 110 includes an isolated area 112 and an active area 114. The source bodies 122 are located in the active area 114. In some embodiments, the active area 114 includes a channel layer 115 and a barrier layer 116. The barrier layer 116 is disposed on top of the channel layer 115. The channel layer 115 and the barrier layer 116 may constitute a heterostructure. Hence, two-dimensional electron gas (2 DEG) is formed at an interface between the channel layer 115 and the barrier layer 116 to serve as a conducting channel of the semiconductor device. When the semiconductor device is in on-state, a conducting current between the source electrode 120 and the drain electrode 130 can flow along the interface between the channel layer 115 and the barrier layer 116. For example, the channel layer 115 may be a gallium nitride (GaN) layer. The barrier layer 116 may be an aluminum gallium nitride (AlGaN) layer. However, the channel layer 115 and barrier layer 116 may be layers of other semiconductor material, such as a nitride-based semiconductor layer.

In addition, the isolated area 112 surrounds the active area 114. Both the first gate bus bar 170 and the second gate bus bar 180 are located in the isolated area 112 to allow the first gate bus bar 170 and the second gate bus bar 180 to be electrically insulated from the active area 114. The isolated area 112 may be a doped structure or a shallow trench isolation (STI) structure, and the present disclosure is not limited in this regard. Additionally, the element layer 110 may be selectively disposed on a substrate 100. The substrate 100 may be, for example, a silicon substrate or a sapphire substrate, but the present disclosure is not limited in this regard. In some embodiments, the semiconductor device can further include a buffer layer 105 disposed between the element layer 110 and the substrate 100.

According to the present embodiment, the source bodies 122 are disposed between the first gate bus bar 170 and the second gate bus bar 180 so a length of the source body 122 may be slightly smaller than 400 micrometers. In some embodiments, the source bodies 122 may overlap the source bus bar 150 and the drain bus bar 160 (as shown in FIG. 1). That is, the source bus bar 150 and the drain bus bar 160 are both disposed above the source bodies 122, and an insulation layer exists between the source bodies 122 and the drain bus bar 160 to insulate sources from drains. Hence, the source bodies 122, the source bus bar 150, and the drain bus bar 160 are all disposed on the element layer 110 in the active area 114. However, in some other embodiments, the source bodies 122 may not overlap the source bus bar 150 (and/or the drain bus bar 160) selectively. For example, the source bodies 122 and the source bus bar 150 (and/or the drain bus bar 160) are formed by patterning a same conductive material layer. Hence, the source bodies 122 are disposed on the element layer 110 in the active area 114, and the source bus bar 150 and/or the drain bus bar 160 are disposed on the element layer 110 in the isolated area 112.

Figure 2B:
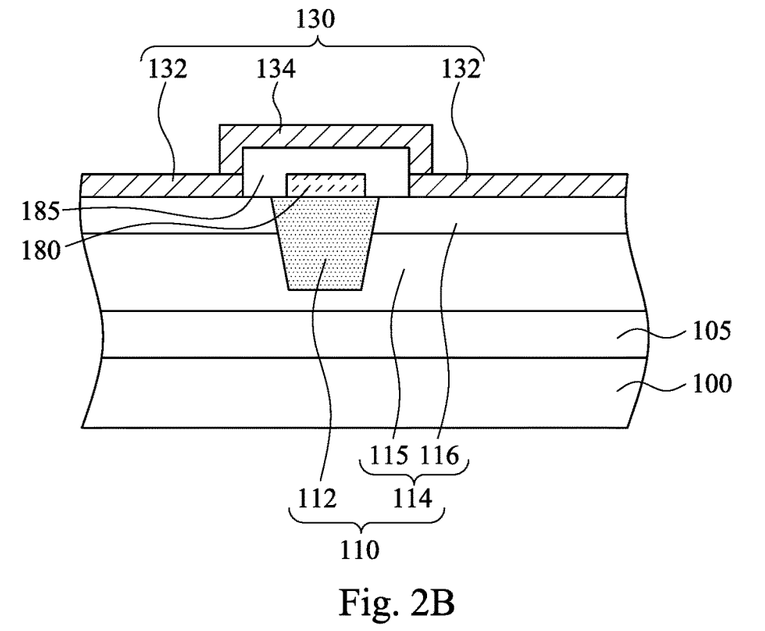
FIG. 2B is a cross-sectional view taking along line 2B-2B of FIG. 1.

FIG. 2B is a cross-sectional view taking along line 2B-2B of FIG. 1. Reference is made to FIGS. 1 and 2B. In the present embodiment, the drain electrode 130 includes a plurality of drain bodies 132 and a drain connecting portion 134. For example, the drain electrode 130 includes the two drain bodies 132 and the one drain connecting portion 134 according to the present embodiment. The drain bodies 132 are disposed on the element layer 110 in the active area 114 and disposed on the two opposite sides of the second gate bus bar 180. The drain connecting portion 134 crosses the second gate bus bar 180 and connects to the drain bodies 132. The drain connecting portion 134 is electrically insulated from the second gate bus bar 180. For example, the insulation layer 185 is further disposed between the second gate bus bar 180 and the drain connecting portion 134 so that the drain connecting portion 134 is electrically insulated from the second gate bus bar 180. Each of the drain bodies 132 may be an ohmic electrode and the drain connecting portion 134 may be a conductive layer, and the present disclosure is not limited in this regard.

According to the present embodiment, the drain bodies 132 are disposed between the first gate bus bar 170 and the second gate bus bar 180 so a length of the drain body 132 may be slightly smaller than 400 micrometers. In some embodiments, the drain bodies 132 may overlap the source bus bar 150 and the drain bus bar 160 (as shown in FIG. 1). That is, the source bus bar 150 and the drain bus bar 160 are both disposed above the drain bodies 132, and an insulation layer exists between the drain bodies 132 and the source bus bar 150 to insulate the sources from the drains. Hence, the drain bodies 132, the source bus bar 150, and the drain bus bar 160 are all disposed on the element layer 110 in the active area 114. However, in some other embodiments, the drain bodies 132 may not overlap the source bus bar 150 (and/or the drain bus bar 160) selectively. For example, the drain bodies 132 and the source bus bar 150 (and/or the drain bus bar 160) are formed by patterning a same conductive material layer. Hence, the drain bodies 132 are disposed on the element layer 110 in the active area 114, and the source bus bar 150 and/or the drain bus bar 160 are disposed on the element layer 110 in the isolated area 112.

Reference is made to FIG. 1. The semiconductor device further includes a gate pad 190 to connect the first gate bus bar 170 to the second gate bus bar 180 according to the present embodiment. The gate pad 190 may have a larger soldering area to allow external circuits to be fixed. In some embodiments, the first gate bus bar 170, the second gate bus bar 180, the gate electrodes 140, and the gate pad 190 may be integrally formed or may be a structure formed in different layers. Alternatively, some of the elements are located in the same layer while the other elements are located in another layer, and the present disclosure is not limited in this regard.

Figure 3:
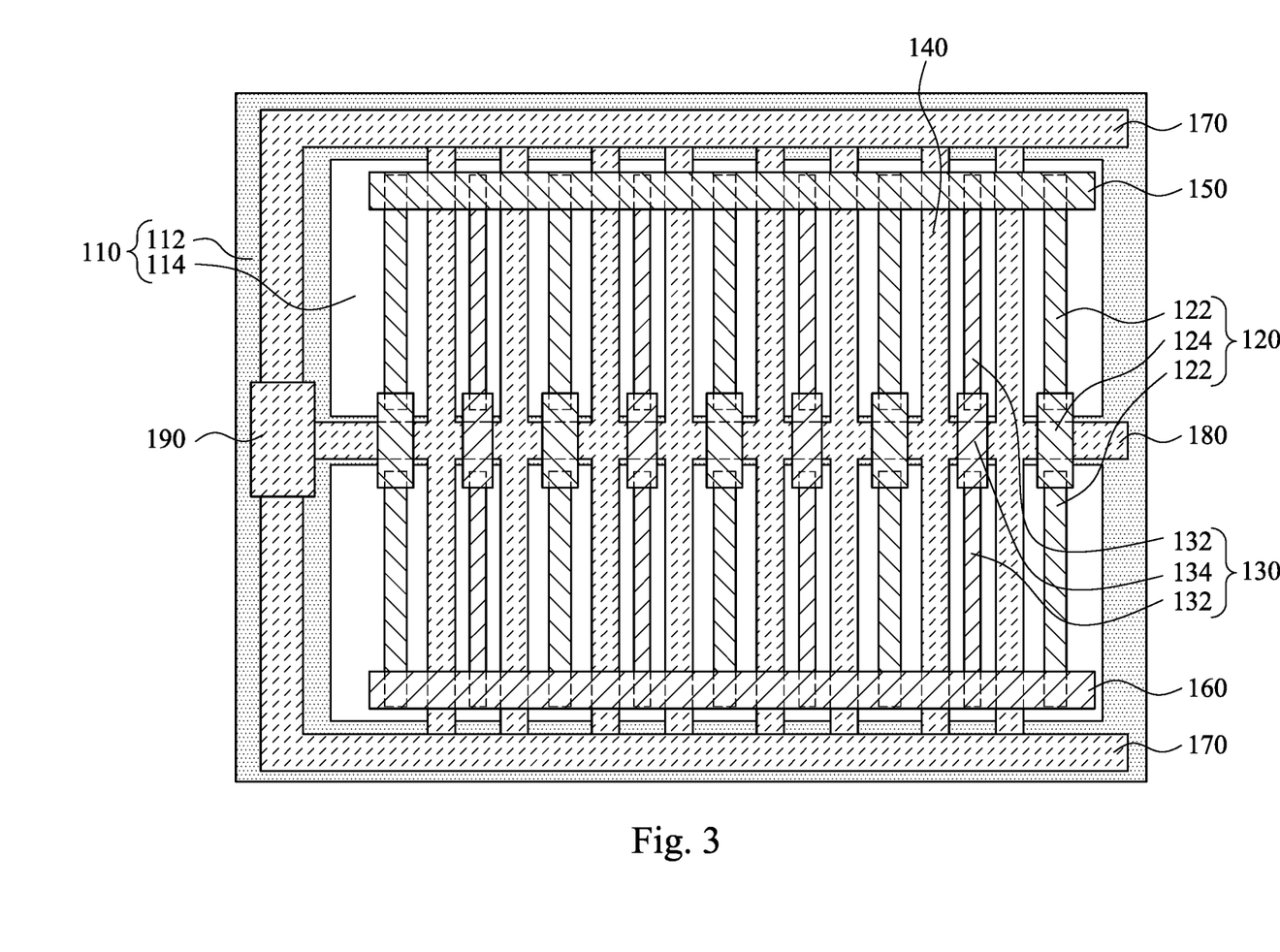
FIG. 3 is a top view of a semiconductor device according to another embodiment of the present disclosure.

FIG. 3 is a top view of a semiconductor device according to another embodiment of the present disclosure. The difference between the present embodiment and the embodiment shown in FIG. 1 is a number of the first gate bus bars 170. In the present embodiment, the number of the first gate bus bars 170 is two. The two first gate bus bars 170 are respectively located at the two opposite ends of the source electrodes 120 (, the drain electrodes 130 and/or the gate electrodes 140), and the second gate bus bar 180 is disposed between the first gate bus bars 170. Such a structure can further reduce gate resistances. Since other details of the present embodiment are the same as those of the embodiment shown in FIG. 1, a description in this regard is not provided.

Figure 4:
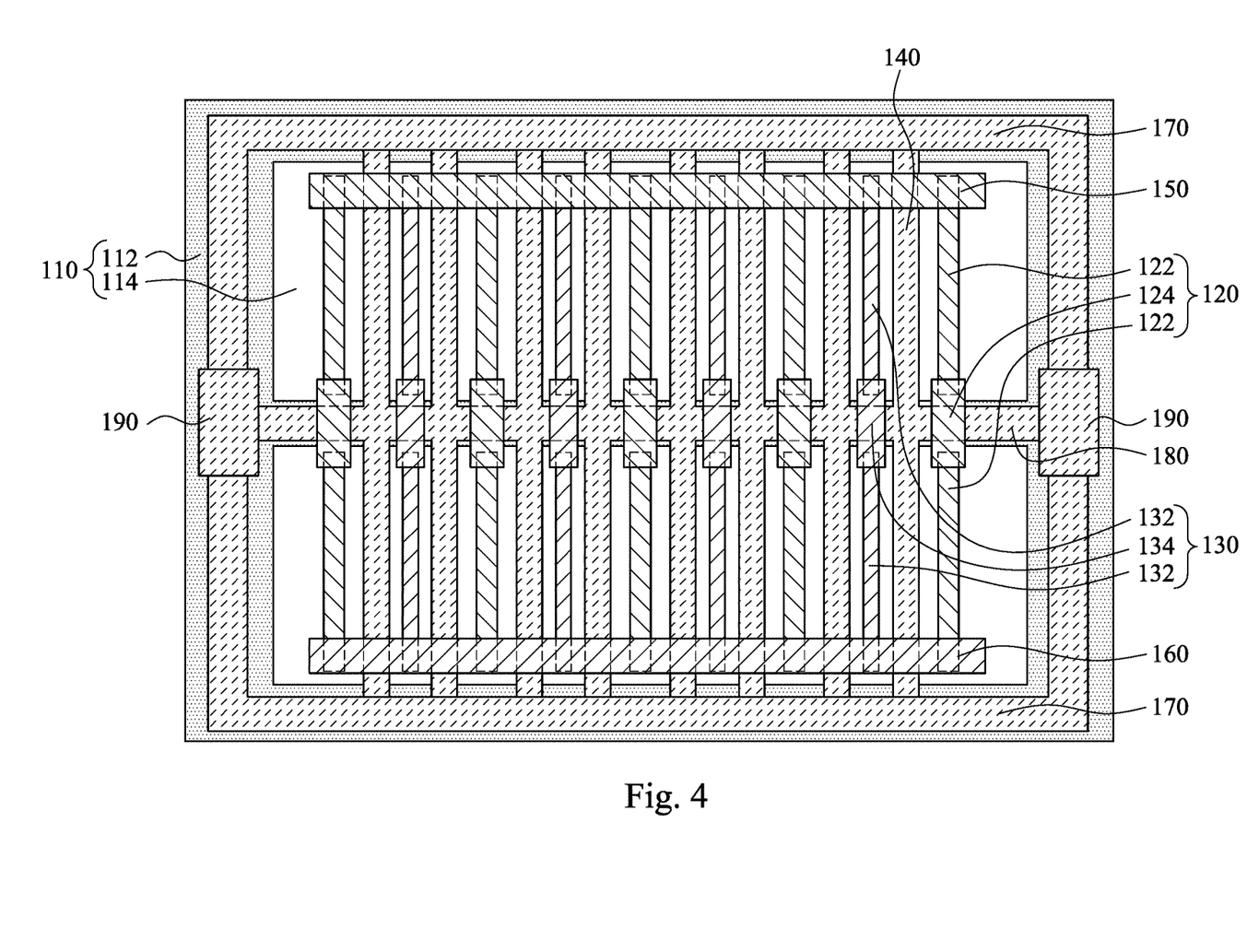
FIG. 4 is a top view of a semiconductor device according to still another embodiment of the present disclosure.

FIG. 4 is a top view of a semiconductor device according to still another embodiment of the present disclosure. The difference between the present embodiment and the embodiment shown in FIG. 3 is a number of the gate pads 190. In the present embodiment, the number of the gate pads 190 is two. The two gate pads 190 are respectively located on two opposite sides of the first gate bus bars 170 and the second gate bus bar 180. Hence, current paths of the first gate bus bars 170 and the second gate bus bar 180 can be shortened by half to further reduce gate resistances. In some other embodiments, the number of the gate pads 190 may be greater than two to further reduce gate resistances. In addition, the number of the first gate bus bar 170 may be one. Since other details of the present embodiment are the same as those of the embodiment shown in FIG. 3, a description in this regard is not provided.

Figure 5:
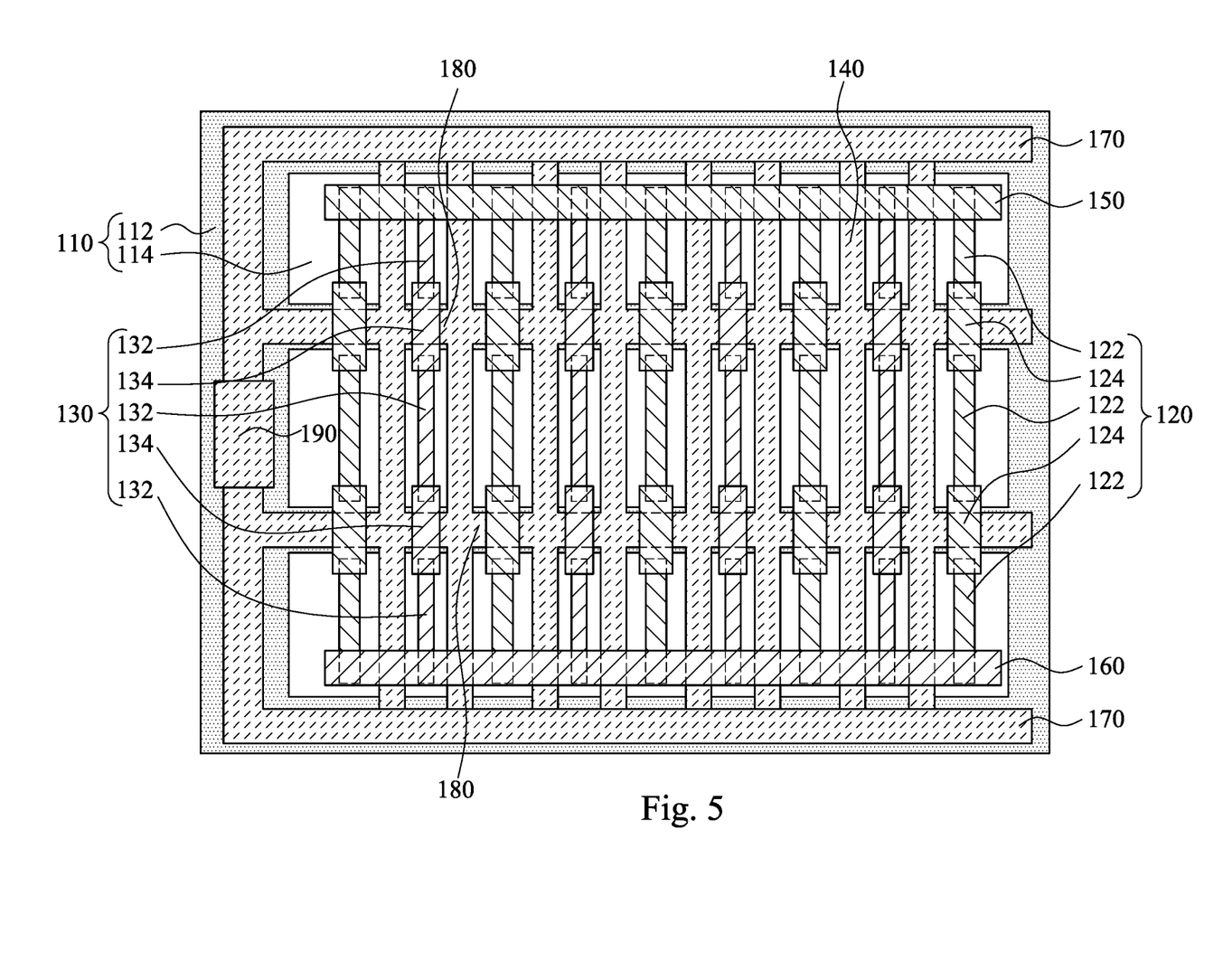
FIG. 5 is a top view of a semiconductor device according to yet another embodiment of the present disclosure.

FIG. 5 is a top view of a semiconductor device according to yet another embodiment of the present disclosure. The difference between the present embodiment and the embodiment shown in FIG. 3 is a number of the second gate bus bars 180. In the present embodiment, the number of the second gate bus bars 180 is plural, for example, two. The two second gate bus bars 180 are disposed between the first gate bus bars 170. As a result, transmission paths of currents of the gate electrodes 140 can be further shortened to reduce gate resistances.

As shown in FIG. 5, when the number of the second gate bus bars 180 is two, each of the source electrodes 120 includes the three source bodies 122 and the two source connecting portions 124. The source bodies 122 are respectively disposed between the first gate bus bars 170 and the second gate bus bars 180 and between the two second gate bus bars 180, and the source connecting portions 124 are disposed above the second gate bus bars 180 to connect the adjacent source bodies 122. In addition, each of the drain electrodes 130 includes the three drain bodies 132 and the two drain connecting portions 134. The drain bodies 132 are respectively disposed between the first gate bus bars 170 and the second gate bus bars 180 and between the two second gate bus bars 180, and the drain connecting portions 134 are disposed above the second gate bus bars 180 to connect the adjacent drain bodies 132. In some embodiments, the number of the gate pads 190 may be plural. Additionally, the number of the first gate bus bar 170 may be one. Since other details of the present embodiment are the same as those of the embodiment shown in FIG. 3, a description in this regard is not provided.

Figure 6:
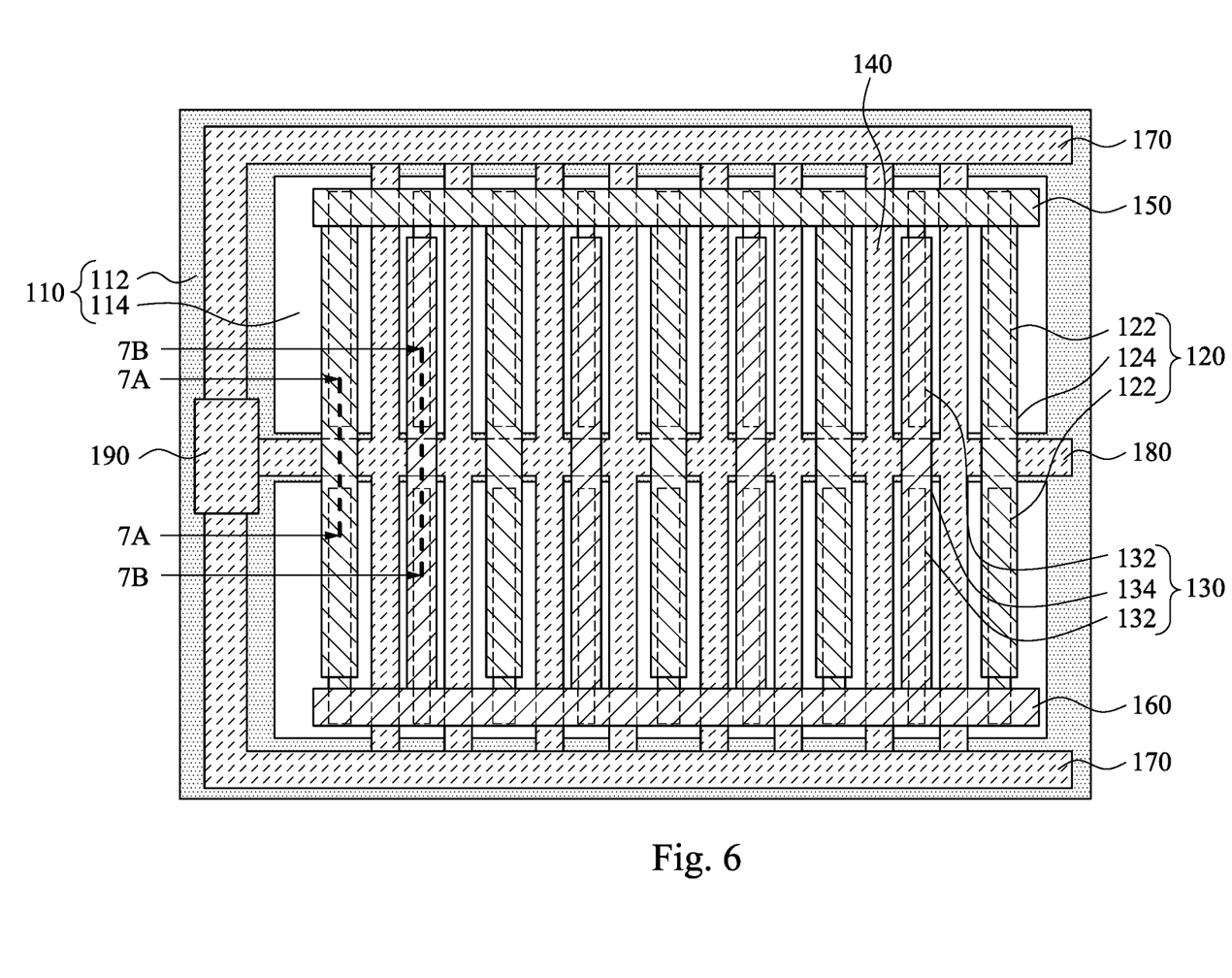
FIG. 6 is a top view of a semiconductor device according to another embodiment of the present disclosure.
Figure 7A:
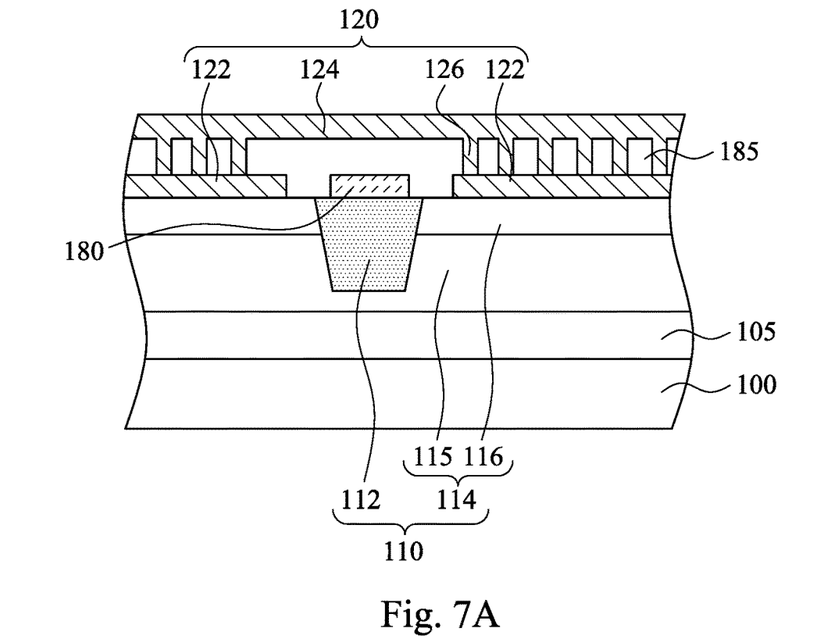
FIG. 7A is a cross-sectional view taking along line 7A-7A of FIG. 6.

FIG. 6 is a top view of a semiconductor device according to another embodiment of the present disclosure. FIG. 7A is a cross-sectional view taking along line 7A-7A of FIG. 6. Reference is made to FIGS. 6 and 7A. The difference between the present embodiment and the embodiment shown in FIG. 3 is structures of the source electrodes 120 and the drain electrodes 130. In the present embodiment, the source electrode 120 includes the plurality of source bodies 122, the source connecting portion 124, and a plurality of source vias 126. The source bodies 122 are disposed on the element layer 110 and disposed on the two opposite sides of the second gate bus bar 180. The insulation layer 185 covers the source bodies 122 and the second gate bus bar 180. The source connecting portion 124 is disposed on the insulation layer 185 and the source bodies 122, and crosses the second gate bus bar 180. The source vias 126 are located in the insulation layer 185 and interconnect the source connecting portion 124 and the source bodies 122. According to the present embodiment, the source connecting portion 124 can not only connect to the source bodies 122 but also further reduce an overall resistance of the sources. More specifically, the source bodies 122 are, for example, ohmic electrodes that have a higher resistance value per unit length, and the source connecting portion 124 has a resistance value per unit length lower than the resistance value per unit length of the source bodies 122. Therefore, the source connecting portion 124 and the source bodies 122 can have sufficient electrical connection between them via the source vias 126 so as to reduce the overall resistance of the sources.

Figure 7B:
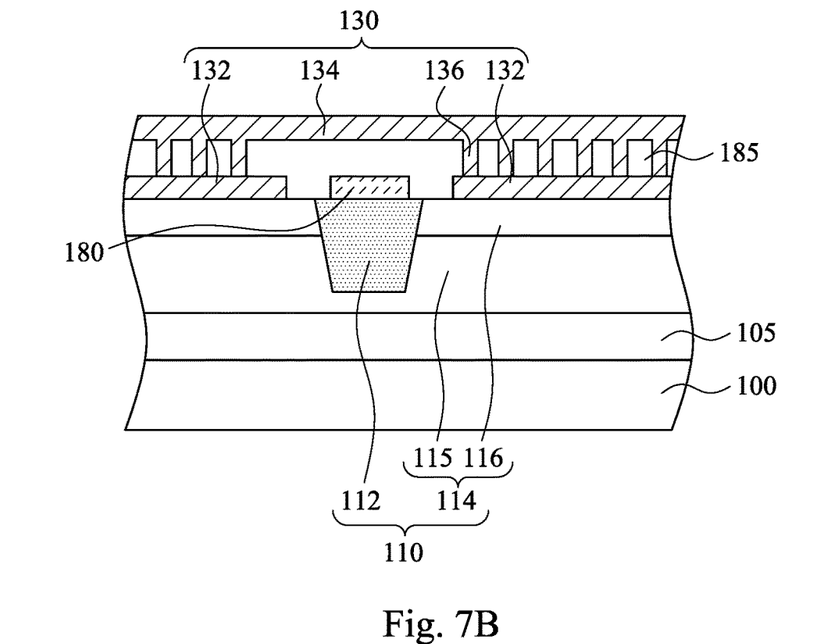
FIG. 7B is a cross-sectional view taking along line 7B-7B of FIG. 6.

FIG. 7B is a cross-sectional view taking along line 7B-7B of FIG. 6. Reference is made to FIGS. 6 and 7B. The drain electrode 130 includes the plurality of drain bodies 132, the drain connecting portion 134, and a plurality of drain vias 136. The drain bodies 132 are disposed on the element layer 110 and disposed on the two opposite sides of the second gate bus bar 180. The insulation layer 185 further covers the drain bodies 132. The drain connecting portion 134 is disposed on the insulation layer 185 and the drain bodies 132, and crosses the second gate bus bar 180. The drain vias 136 are located in the insulation layer 185 and interconnect the drain connecting portion 134 and the drain bodies 132. According to the present embodiment, the drain connecting portion 134 can not only connect to the drain bodies 132 but also further reduce an overall resistance of the drains. More specifically, the drain bodies 132 are, for example, ohmic electrodes that have a higher resistance value per unit length, and the drain connecting portion 134 has a resistance value per unit length lower than the resistance value per unit length of the drain bodies 132. Therefore, the drain connecting portion 134 and the drain bodies 132 can have sufficient electrical connection between them via the drain vias 136 so as to reduce the overall resistance of the drains.

Reference is made to FIG. 6. In some embodiments, the source connecting portion 124 and the source bus bar 150 may be integrally formed, for example, made by the same process and made from the same material. However, in some other embodiments, the source connecting portion 124 and the source bus bar 150 may be made by different processes and/or made from different materials. The source bodies 122 may overlap the source bus bar 150 and the drain bus bar 160 (as shown in FIG. 6) as long as another insulation layer is disposed between the source bodies 122 and the drain bus bar 160. However, the source bodies 122 may not overlap the source bus bar 150 (and/or the drain bus bar 160). In addition, the drain connecting portion 134 and the drain bus bar 160 may be integrally formed, for example, made by the same process and made from the same material. However, in some other embodiments, the drain connecting portion 134 and the drain bus bar 160 may be made by different processes and/or made from different materials. The drain bodies 132 may overlap the source bus bar 150 and the drain bus bar 160 (as shown in FIG. 6) as long as another insulation layer is disposed between the drain bodies 132 and the source bus bar 150. However, the drain bodies 132 may not overlap the source bus bar 150 (and/or the drain bus bar 160). The semiconductor device according to the present embodiment may include the plurality of gate pads 190 and/or the plurality of second gate bus bars 180. In addition, the number of the first gate bus bar 170 may be one. Since other details of the present embodiment are the same as those of the embodiment shown in FIG. 3, a description in this regard is not provided.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of the present disclosure provided they fall within the scope of the following claims and their equivalents.

What is claimed is:

1. A semiconductor device comprising:
an element layer;
a plurality of source electrodes and a plurality of drain electrodes disposed on the element layer, the source electrodes and the drain electrodes being arranged alternately and extending along a first direction;
a plurality of gate electrodes disposed on the element layer and respectively disposed between the source electrodes and the drain electrodes and extending along the first direction;
a source bus bar disposed on the element layer and electrically connected to the source electrodes and extending along a second direction, the second direction being interlaced with the first direction;
a drain bus bar disposed on the element layer and electrically connected to the drain electrodes and extending along the second direction, the source bus bar and the drain bus bar being respectively disposed at two opposite ends of at least one of the source electrodes;
at least one first gate bus bar connected to the gate electrodes and extending along the second direction, the first gate bus bar being disposed at one end of at least one of the source electrodes; and
at least one second gate bus bar connected to the gate electrodes and extending along the second direction, the source electrodes and the drain electrodes overlapping the second gate bus bar in a third direction.

2. The semiconductor device of claim 1, wherein a first distance is formed between the source bus bar and the drain bus bar, and a second distance is formed between the second gate bus bar and the first gate bus bar, the first distance is greater than the second distance.

3. The semiconductor device of claim 1, wherein one of the source electrodes comprises:
a plurality of source bodies disposed on the element layer and disposed on two opposite sides of the second gate bus bar; and
a source connecting portion overlapping the second gate bus bar in the third direction and connected to the source bodies, the source connecting portion being electrically insulated from the second gate bus bar.

4. The semiconductor device of claim 3, wherein at least one of the source bodies is disposed between the first gate bus bar and the second gate bus bar.

5. The semiconductor device of claim 3, wherein one of the drain electrodes comprises:
a plurality of drain bodies disposed on the element layer and disposed on the two opposite sides of the second gate bus bar; and
a drain connecting portion overlapping the second gate bus bar in the third direction and connected to the drain bodies, the drain connecting portion being electrically insulated from the second gate bus bar.

6. The semiconductor device of claim 5, wherein at least one of the drain bodies is disposed between the first gate bus bar and the second gate bus bar.

7. The semiconductor device of claim 5, wherein the element layer comprises an active area and an isolated area, the source bodies and the drain bodies are located in the active area, and the second gate bus bar is located in the isolated area.

8. The semiconductor device of claim 5, wherein element layer comprises a surface, the source bodies of the plurality of source bodies and the drain bodies of the plurality of drain bodies are on the surface of the element layer, the source connecting portion is over the second gate bus bar, and the drain connecting portion is over the second gate bus bar.

9. The semiconductor device of claim 1, further comprising an insulation layer covering the second gate bus bar, wherein one of the source electrodes comprises:
a plurality of source bodies disposed on the element layer and disposed on two opposite sides of the second gate bus bar, and the insulation layer covering the source bodies;
a source connecting portion disposed on the insulation layer and the source bodies and crossing the second gate bus bar; and
a plurality of source vias located in the insulation layer and interconnecting the source connecting portion and the source bodies.

10. The semiconductor device of claim 9, wherein one of the drain electrodes comprises:
a plurality of drain bodies disposed on the element layer and disposed on the two opposite sides of the second gate bus bar, and the insulation layer covering the drain bodies;
a drain connecting portion disposed on the insulation layer and the drain bodies and crossing the second gate bus bar; and
a plurality of drain vias located in the insulation layer and interconnecting the drain connecting portion and the drain bodies.

11. The semiconductor device of claim 10, wherein at least one of the drain bodies is disposed between the first gate bus bar and the second gate bus bar.

12. The semiconductor device of claim 10, wherein the element layer comprises an active area and an isolated area, the source bodies and the drain bodies are located in the active area, and the second gate bus bar is located in the isolated area.

13. The semiconductor device of claim 9, wherein at least one of the source bodies is disposed between the first gate bus bar and the second gate bus bar.

14. The semiconductor device of claim 1, wherein a plurality of the first gate bus bars are located at two opposite ends of at least one of the source electrodes, and the second gate bus bar is disposed between the first gate bus bars.

15. The semiconductor device of claim 1, wherein a number of the at least one second gate bus bar is plural.

16. The semiconductor device of claim 1, further comprising:
a gate pad connected to the first gate bus bar and the second gate bus bar.

17. The semiconductor device of claim 16, wherein two of the gate pads are respectively located at two opposite ends of the first gate bus bar and the second gate bus bar.

* * * * *